United States Patent [19]

Greenwald

[11] Patent Number: 5,104,690
[45] Date of Patent: Apr. 14, 1992

[54] CVD THIN FILM COMPOUNDS

[75] Inventor: Anton C. Greenwald, North Andover, Mass.

[73] Assignee: Spire Corporation, Bedford, Mass.

[21] Appl. No.: 533,874

[22] Filed: Jun. 6, 1990

[51] Int. Cl.$^5$ .................... C23C 16/40; C23C 16/46
[52] U.S. Cl. ................. 427/126.3; 427/255.1; 427/255.2; 427/255.3; 106/1.05
[58] Field of Search ............... 427/126.3, 255.1, 255.2, 427/255.3; 106/1.05

[56] References Cited

U.S. PATENT DOCUMENTS

| | | | |
|---|---|---|---|
| 3,690,290 | 9/1972 | Jarvela et al. | 118/48 |
| 3,885,061 | 5/1975 | Corboy et al. | 117/201 |
| 4,443,488 | 4/1984 | Little et al. | 427/38 |
| 4,468,283 | 8/1984 | Ahmed | 156/642 |
| 4,596,208 | 6/1986 | Wolfson et al. | 118/712 |
| 4,743,493 | 5/1988 | Sloshansi et al. | 428/217 |
| 4,753,818 | 6/1988 | Rogers, Jr. | 427/54.1 |
| 4,792,463 | 12/1988 | Okada et al. | 427/126.3 |

FOREIGN PATENT DOCUMENTS 56-48237  5/1981  Japan ................. 118/715

OTHER PUBLICATIONS

D. W. Bondurant et al. "Ferroelectrics for nonvolatile RAMs", IEEE Spectrum, Jul. 1989; pp. 30–33.
R. Takayama et al. "Preparation of epitaxial Pb($Zr_x Ti_{1-x}$)$O_3$ thin films and their crystallographic, pyroelectric, ferroelectric properties", J. Appl. Phys. 65(4), Feb. 15, 1989; pp. 1666–1670.
S. G. Yoon et al., "Preparation and Deposition Mechanism of Ferroelectric PbTiO$_3$ Thin Films by Chemical Vapor Deposition", J. Electrochem Soc.: Solid State Science & Technology, Dec. 1988; pp. 3137–3140.
B. S. Kwak et al. "Metallorganic chemical vapor deposition of PbTiO$_3$ thin films", Appl. Physics Lett. (18), 31, Oct. 31, 1988; pp. 1702–1704.
G. Y. Zheng et al. "Preparation of Pb(Zr$_3$Ti)O$_3$ thin films by sol gel processing: electrical, optical, and electro-optic properties", J. Appl. Phys. 64(5) Sep. 1, 1988, pp. 2717–2724.
J. F. Scott et al. "Switching kinetics of lead zirconate titanate submicron thin film memories", J. Appl. Phys. 64(2), Jul. 15, 1988, pp. 787–792.
M. Ishida et al. "Electro-optic effects of PLZT thin films", Appl. Physics Lett., vol. 31, No. 7, Oct. 1, 1977, pp. 433–434.
S. B. Krupanidhi et al. "rf planar magnetron sputtering and characterization of ferroelectric Pb(Zr$_3$Ti)O$_3$ films", J. Appl. Phys. 54(11, Nov. '83; pp. 6601–6609.
P. D. Dapkus "Metalorganic Chemical Vapor Deposition", Ann. Rev. Mater. Sci., 1982; pp. 243–269.
M. Ishida et al. "Preparation and properties of ferroelectric PLZT thin films by rf sputtering", J. Appl. Phys. 48(3), Mar. 1977; pp. 951–953.
S. L. Swartz et al. "Characterization of MOCVD PbTiO$_3$ Thin Films", Presented at Zurich ISAF Conference, Sep. 1988.
W. A. Geideman et al., "Progress in Ferroelectric Memory Technology", pp. 543–545, 1988.

Primary Examiner—Shrive Beck
Assistant Examiner—Margaret Burke
Attorney, Agent, or Firm—Morse, Altman, Dacey & Benson

[57] ABSTRACT

A stream of gaseous source compounds and their ranges of relative ratios useful in the deposition of thin film ferroelectric materials by CVD are disclosed. The stream of gaseous source compounds are used in combination with a CVD reactor flushed with an inert gas and maintained at a predetermined internal pressure and, a substrate disposed within the CVD reactor and maintained at a predetermined temperature. The steam of gaseous source compounds include a Zr source compound, a Ti source compound, a Pb source compound, an oxidizing agent compound, and an inert gas, as well as their ranges of relative ratios to deposit lead-zirconate-titanate, related ferroelectrics, specifically including lead-lanthanum-zirconium-titanate.

8 Claims, 1 Drawing Sheet

CVD THIN FILM COMPOUNDS

This invention has been conceived and, at least in part, reduced practice in the performance of work funded by a subcontract of the U.S. Navy.

BACKGROUND OF THE INVENTION

1. Field of The Invention

The present invention relates generally to chemical vapor deposition (CVD) of thin films and, more particularly, to specific source compounds useful in the CVD of ferroelectric thin films.

2. The Prior Art

Lead zirconate titanate (PZT) ferroelectric thin films and their related alloys, such as ferroelectric PLZT thin films (i.e., less than ten microns and preferably about 0.15 micron to about one micron) find widespread applications in capacitors, specifically high energy density capacitors (requiring a dielectric possessing a high dielectric constant), for fast, nonvolatile integrated digital memories, for pyroelectric infrared sensors, for optical switches with nonlinear optical properties, for piezoelectric transducers and for surface acoustic wave devices. Despite a heavy demand, utilization of such ferroelectric thin films has been hampered by the non-existence of a reliable, large scale manufacturing process for economically producing device-quality ferroelectric thin films. To be sure, this was not for a lack of trying.

Beginning in the 1970's and continuing to the present, a lot of investigative effort has been directed at depositing ferroelectric thin films by sputtering methods, see M. Ishida et al., "Preparation and properties of ferroelectric PLZT thin films by rf sputtering," *Journal of Applied Physics*, Vol 48, No. 3, March 1977, pp. 951–953, and R. Takayama et al., "Preparation of epitaxial $Pb(Zr_xTi_{1-x})O_3$ thin films and their crystallographic, pyroelectric, and ferroelectric properties," *J. Appl. Physics* 65(4), 15 Feb. 1989, pp. 1666–1670. A further effort involving the preparation of ferroelectric thin films has focused on sol gel processing, see G. Yi et al., "Preparation of $Pb(Zr,Ti)O_3$ thin films by sol gel processing: Electrical, optical, and electro-optic properties," *J. Appl. Physics* 64(5), 1 Sept. 1988, pp. 2717–2724. Both of these processes suffer from: limitations in achieving uniformity and reproducibility (including mixed phases of microscopically varying compositions) in the thin films produced, relatively low production rates, difficulties encountered by incompatibility of substrates and, inability to adapt the process to scale-up production. Additionally, the thin films produced have exhibited unacceptable levels of impurity concentrations, i.e., in excess of 100 parts per million atomic concentration (ppma) of contaminants.

With the advent of chemical vapor deposition (CVD) and metal-organic chemical vapor deposition (MOCVD), several workers in the field have begun to use such techniques with several materials and with various degrees of success. As known, CVD offers fast deposition rates, CVD reactors can be scaled up to the deposition on large-area substrates and film uniformity is excellent with the CVD process. Most of this effort has, however, focused on the CVD or MOCVD deposition of ferroelectric lead-titanate ($PbTiO_3$) thin films. See S. Yoon et al., "Preparation and Deposition Mechanism of Ferroelectric $PbTiO_3$ Thin Films by Chemical Vapor Deposition," *J. Electrochem. Soc.* (Dec. 1988), pp. 3137–3140; B. S. Kwak et al; "Metalorganic chemical vapor deposition of $PbTiO_3$ thin films," *Appl. Phys. Lett.* 53(18) 31 Oct. 1988, pp. 1702–1704; and S. L. Swartz et al., "Characterization of MOCVD $PbTiO_3$ Thin Films," presented at the *Zurich ISAF Conference*, Sept, 1988.

SUMMARY OF THE INVENTION

It is a principal object of the present invention to overcome the above disadvantages by providing ferroelectric thin film materials by chemical vapor deposition having improved electrical properties and greater uniformity and providing specific source compounds and their relative ratios useful in the deposition of lead-zirconate-titanate and related ferroelectrics, specifically including lead-lanthanum-zirconate-titanate.

More specifically, it is an object of the present invention to provide, in combination with a CVD reactor maintained at a predetermined pressure and flushed with an inert gas, and a substrate within the reactor and maintained at a predetermined temperature, a stream of gases useful in the deposition of thin film ferroelectric materials and introduced into the reactor at certain relative ratios. Preferably, the thin film ferroelectric material is lead zirconate titanate [$Pb(Zr,Ti)O_3 = PZT$] or lead-lanthanum zirconate titanate [$(Pb,La)(Zr,Ti)O_3 = PLZT$]. Preferably, the inert gas is argon, helium or nitrogen and the stream of gases comprises a zirconium source compound consisting of one of tetrakisdiethylamino zirconium, trifluoroacetylacetonate zirconium or acetylacetonate zirconium; a titanium source compound consisting of one of tetrakisdimethylamino titanium, tetrakisdi-ethylamino titanium, or titanium isopropoxide; a lead source compound consisting of tetraethyl lead or z-ethylhexanoate; and an oxidizing agent consisting of one of nitrous oxide, oxygen, water vapor, n-propanol, or i-butanol. The PZT material may be doped with (a) barium, calcium, lanthanum or strontium in lieu of lead, or (b) iron and niobium as substitutes for titanium and zirconium.

Other and further objects of the present invention will in part be obvious and will in part appear hereinafter.

The invention accordingly comprises, in combination with a CVD reactor and a substrate provided therein, the stream of gaseous source compounds and their respective ratios introduced therein useful in the deposition of thin film ferroelectric materials of the present disclosure, the scope of which will be indicated in the appended claims.

BRIEF DESCRIPTION OF THE DRAWINGS

For a fuller understanding of the nature and objects of the present invention, reference is to be made to the following detailed description, which is to be taken in connection with the accompanying drawings, wherein.

DETAILED DESCRIPTION OF THE PREFERRED EMBODIMENTS

In general, the present invention relates, in combination with a CVD and/or MOCVD reactor containing an inert gas and a heated substrate, to a stream of gaseous source compounds and their ranges of relative ratios and introduced into the CVD reactor in the deposition of high purity thin films of doped PZT and PLZT materials. The dopants can include barium, calcium, lanthanum and strontium in lieu of lead, or iron and niobium as substituted for titanium and zirconium. As known, ferroelectric PZT and PLZT thin films (i.e., less than ten microns and preferably about 0.15 micron to about one micron) find widespread applications in capacitors, specifically high energy density capacitors (requiring a dielectric possessing a high dielectric constant), for fast, nonvolatile integrated digital memories, for pyroelectric infrared sensors, for optical switches with nonlinear optical properties, for piezoelectric transducers and for surface acoustic wave devices. Despite a heavy demand, utilization of such ferroelectric thin films has been hampered by the non-existence of a reliable, large scale manufacturing process for economically producing device-quality ferroelectric thin films.

Figure 1:
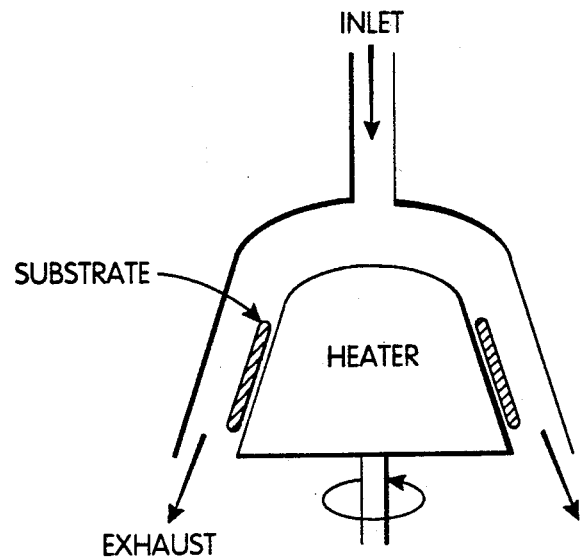
FIG. 1 is a schematic of one representative CVD reactor useful in practicing the invention.
Figure 2:
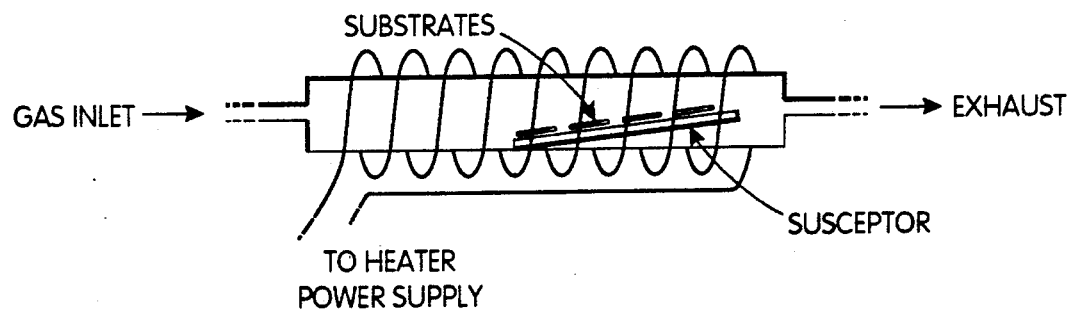
FIG. 2 is a schematic of another representative CVD reactor useful in practicing the invention.
Figure 3:
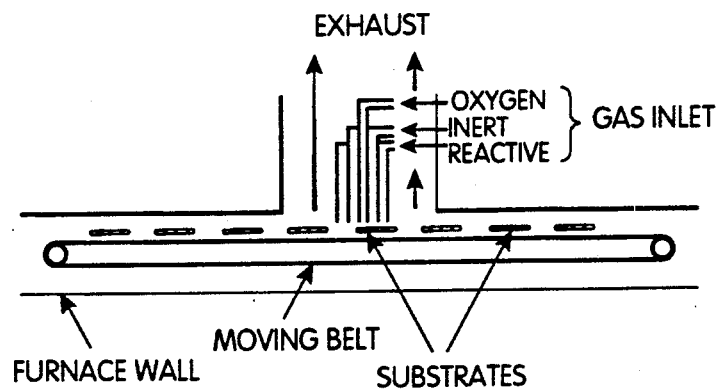
FIG. 3 is a schematic of still another representative CVD reactor useful in practicing the invention.

The particular CVD apparatus used can be either a vertical design reactor illustrated in FIG. 1, a horizontal design reactor illustrated in FIG. 2, or a belt furnace type reactor illustrated in FIG. 3, or any like CVD reactor. One specific preferred CVD reactor useful in practicing the invention and similar to the one illustrated in FIG. 1 herein is more fully described in U.S. Pat. No. 4,596,208, Wolfson et al., CVD REACTION CHAMBER, granted Jun. 24, 1986 and assigned to a common assignee, Spire Corporation of Bedford, Mass., the disclosure of which is incorporated herein by reference.

As known, MOCVD generally refers to the deposition of multiconstituent films, whether epitaxial, polycrystalline or amorphous, employing any of several metalorganic compounds for the source of one or more of the constituents. In all cases, a vapor-phase reaction takes place in a reactor having a heated susceptor and a thereon disposed substrate. In the reactor, the organometallic compounds are pyrolized by the heat of the susceptor and the substrate to form the respective atomic or molecular forms of the constituents, which constituents recombine to form the semiconductor films on the substrate.

The CVD reactor of said U.S. Pat. No. 4,596,208 features a reaction chamber for CVD comprising a vertical reaction tube having a tapered top provided with a concentric gas inlet, a bottom provided with a gas outlet, a base plate for supporting the reaction tube, and a tapered susceptor operatively supported within the reaction tube in close proximity to its tapered top and defining an angle therebetween. A vertical reactor of this type operates in a non-laminar, turbulent mode, precluding abrupt changes in gas compositions. The CVD reactor further includes a gas-mixing system preferably including a fully automated gas manifold, a power supply and a heat source, and a microprocessor. The gas-mixing system preferably includes a plurality of temperature controlled bubbles containing the various metalorganic source compounds required to deposit the desired thin film ferroelectric materials on the heated substrates within the CVD reactor chamber. The operation of the gas-mixing system is controlled and monitored on a panel. The panel displays, among others, a flow chart featuring lines and lights to indicate the admission of one or more of the source compounds, plus an inert gas into a mixing manifold prior to reaching the reactor tube. The gas-mixing system preferably is designed to allow the growth of thin layers with abrupt transitions between the layers. The combination power supply and heat source preferably includes the devices needed to power the radio frequency (RF) coils so as to inductively heat the susceptor in the reaction chamber. Susceptor temperature preferably is controlled by thermocouple feedback to the source. The CVD reactor also preferably includes a vacuum system to achieve the required vacuum within the reaction chamber.

Thus, the selected particular CVD reactor provides, in all cases, means for controlled heating of a substrate upon which the PZT film is deposited, controlled means of delivering vapors of metalorganic compounds to the deposition reactor which contain lead, titanium, zirconium, and other possible dopants, and controlled means of adding oxidants and possibly inert gases to the deposition reactor.

The pressure in the deposition reactor may be near atmospheric pressure for all configurations shown, or it may be in the range 0.01 to 100 torr for the configurations shown in FIGS. 1 and 2 only. In low pressure operation, a plasma may be induced in the gaseous environment in the deposition reactor.

For a plasma ion deposition process of large-grain, thin semiconductor films directly on low-cost amorphous substrates, see U.S. Pat. No. 4,443,488, Little et al., granted Apr. 17, 1984, also to the common assignee herein, Spire Corporation of Bedford, Mass., the disclosure of which is incorporated herein by reference.

Plasma ion deposition of ceramics comprises ionizing a metalorganic gaseous compound and oxygen, extracting high energy ions containing metal atoms and excited oxygen ions thereof, depositing the ions on a substrate held at a controlled temperature so as to permit the ions to react on the surface enhancing the grain growth of the ceramic crystals. Preferably, the extracted ions possess high surface mobilities. The ionization is effected in a chamber by an electron-supported plasma, the plasma being a large volume, low pressure, high temperature plasma.

$Pb(Zr_xTi_{1-x})O_3$ (PZT) thin films can be deposited in a CVD reactor at atmospheric pressure in an inert atmosphere of either argon, helium or nitrogen with the addition of:

| | |
|---|---|
| tetrakisdiethylamino zirconium | 0.1 to 1000 ppma |
| tetrakisdimethylamino titanium | 0.1 to 1000 ppma |
| tetraethyl lead | 0.1 to 1000 ppma |
| nitrous oxide | 0.1 to 1000 ppma |

The abbreviation ppma signifies parts per million atomic concentration.

EXAMPLE I

A thin film ferroelectric PZT material has been depicted in a CVD reactor, with the following deposition parameters:

tetraethyl-lead, held at 17.8° C., vapor pressure about 0.2 mm, carrier flow 63 sccm;

tetrakisdimethyl titanium held at 46.5° C., vapor pressure about 0.05 mm, carrier flow 50 sccm;

tetrakisdiethyl zirconium, held at 110° C., vapor pressure about 0.1 mm, carrier flow 90 sccm;

1% $N_2O$ in Ar, flow at 20 sccm; and additional argon flow at 4800 sccm, with argon being used as a carrier gas; and at atmospheric pressure (i.e., about 760 mm; 760 torr) with CVD reactor concentrations being at about:

Pb 3.3 ppma;

Ti 0.65 ppma;
Zr 2.4 ppma;
nitrous oxide 39.8 ppma; and
balance argon;

which has resulted in a ferroelectric thin film having an approximate composition of $Pb(Zr_{0.85},Ti_{0.15})O_3$.

The composition of the resultant thin film can be varied by changing the relative flow rates of the carrier gas. For constant flow of the lead compound, any pseudo-binary between pure lead-titanate and pure lead-zirconate can be deposited for Ti concentrations between zero and 4 ppma; zirconium concentrations between zero and 3 ppma. The concentration of the elements in the final film do not vary linearly with the concentrations of the elements in the gas phase.

The composition of the resultant thin film, therefore, can vary as follows:

$$Pb(Zr_x, Ti_{1-x})O_3$$

with x ranging from about 0.1 to about 0.9; and more specifically from about 0.45 to about 0.65.

Metalorganic sources for dopants for PZT include:

$La(C_{11}H_{19}O_2)_3$ Tris (2,2,6,6 - tetramethyl-3,5-heptanedionato) lanthanum;

$Sr(C_{11}H_{19}O_2)_3$ Tris (2,2,6,6 - tetramethyl-3,5-heptanedionato) strontium;

$Nd(C_{11}H_{19}O_2)_3$ Tris (2,2,6,6 - tetramethyl-3,5-heptanedionato) neodymium; also known as (TMHD); and $Nd(C_5H_4O_2F_3)_3$ Neodymium trifluoroacetylacetonate.

Thus it has been shown and described, in combination with a CVD reactor flushed with an inert gas and maintained at a predetermined internal pressure and a substrate disposed within the reactor and maintained at a predetermined temperature, a stream of gaseous source compounds and their ranges of relative ratios useful in the deposition of thin film PZT and/or PLZT ferroelectric materials by CVD and/or MOCVD, which combination and compounds satisfy the objects and advantages set forth above.

Since certain changes may be made in the present disclosure without departing from the scope of the present invention, it is intended that all matter described in the foregoing specification or shown in the accompanying drawings, be interpreted in an illustrative and not in a limiting sense.

What is claimed is:

1. A method for the deposition of thin film ferroelectric materials by CVD comprising:
   (a) maintaining a CVD reactor at near atmospheric pressure, said reactor containing an inert gas;
   (b) providing a substrate within said CVD reactor held at a predetermined temperature from about 200° C. to about 800° C.; and
   (c) introducing a stream of gases into said CVD reactor comprising:
   a zirconium source compound from about 2.4 to about 5 ppma,
   a titanium source compound from about 0.65 to about 3 ppma,
   a lead source compound from about 3 to about 8 ppma, an oxidizing agent from about 39 to about 83 ppma, with the balance being an inert gas;
   (d) said zirconium source compound being tetrakisdiethyl zirconium, held at 110° C., with a vapor pressure of about 0.1 mm, and with a carrier flow 90 sccm; and
   (e) said titanium source compound being tetrakisdimethyl titanium, held at 46.5° C. with a vapor pressure about 0.05 mm, and with a carrier flow 50 sccm.

2. The method of claim 1 wherein said inert gas is one of a group consisting of helium, nitrogen and argon and said predetermined temperature of said substrate is about 200° C., and wherein said zirconium source compound is at least one of the compounds consisting of tetrakisdiethylamino zirconium, and trifluoroacetylacetonate zirconium.

3. The method of claim 1 wherein said titanium source compound is at least one of the compounds consisting of tetrakisdimethylamino titanium, tetrakisdiethylamino titanium and titanium isopropoxide; and wherein said lead source compound is one of the compounds consisting of tetraethyl lead and z-ethylhexanoate; and wherein said oxidizing agent is at least one of the following class consisting of nitrous oxide, oxygen, water vapor, n-propanol, and i-butanol.

4. The method of claim 1 wherein said lead source compound is tetraethyl-lead, held at 17.8° C., with a vapor pressure about 0.2 mm and with a carrier flow 63 sccm; and wherein said oxidizing agent is about 1%$N_2O$ in argon flow at 20 sccm, and with additional argon flow at 4800 sccm.

5. A method for the deposition of thin film ferroelectric materials by CVD comprising:
   (a) maintaining a CVD reactor at a pressure from about $10^{-6}$ torr to about 760 torr, said reactor containing an inert gas;
   (b) providing a substrate within said CVD reactor held at a temperature of at least about 200° C. but not exceeding 800° C.; and
   (c) introducing a stream of gases into said CVD reactor comprising:
   tetrakisdiethylamino zirconium of about 2.4 ppma,
   tetrakisdimethylamino titanium of about 0.65 ppma,
   tetraethyl lead of about 3.3 ppma,
   an oxidizing agent of about 38.8 ppma, and
   an inert gas of about 953,85 ppma;
   (d) said stream of gases being deposited on said substrate with the following deposition parameters:
   tetraethyl-lead, held at 17.8° C., a vapor pressure about 0.2 mm, and a carrier flow 63 sccm;
   tetrakisdimethylamino titanium held at 46.5° C., vapor pressure about 0.05 mm, and a carrier flow 50 sccm;
   tetrakisdiethylamino zirconium, held at 110° C., a vapor pressure about 0.1 mm, a carrier flow 90 sccm, additional argon flow at 4800 sccm.

6. The method of claim 5 wherein said thin film ferroelectric material produced by said stream of gases on said substrate has a deposited thickness of about one micron to about ten microns and a composition of about $Pb(Zr_{0.85},Ti_{0.15})O_3$; and wherein said pressure within said CVD reactor is about atmospheric.

7. A stream of gases for depositing thin film ferroelectric materials by CVD on a substrate in which the resultant ferroelectric thin film has a composition of $Pb(Zr_x, Ti_{1-x})O_3$ wherein x ranges from about 0.1 to about 0.9, said stream of gases comprising:
   (a) a zirconium source compound from about 2.4 to about 5 ppma, (b) a titanium source compound from about 0.65 to about 3 ppma, (c) a lead source compound from about 3 to about 8 ppma, and (d) an oxidizing agent from about 39 to about 83 ppma, with the balance being an inert gas;

(e) said zirconium source compound being at least one of the compounds consisting of tetrakisdiethylamino zirconium and trifluoroacetylacetonate zirconium.

8. The stream of gases of claim 7 wherein the metalorganic sources for dopants include at least one of the group consisting of:

$La(C_{11}H_{19}O_2)_3$ · Tris (2,2,6,6 - tetramethyl-3,5-heptanedionato) lanthanum;

$Sr(C_{11}H_{19}O_2)_3$ Tris (2,2,6,6 - tetramethyl-3,5-heptanedionato) strontium;

$Nd(C_{11}H_{19}O_2)_3$ Tris (2,2,6,6 - tetramethyl-3,5-heptanedionato) neodymium; and $Nd(C_5H_4O_2F_3)_3$ Neodymium trifluoroacetylacetonate;

and wherein x ranges from about 0.45 to about 0.65; and wherein the deposited film has a thickness from about 1,000 Angstroms to about ten microns.

* * * * *